(12) United States Patent
Feng et al.

(10) Patent No.: US 11,562,677 B2
(45) Date of Patent: Jan. 24, 2023

(54) DISPLAY APPARATUSES, GATE DRIVE CIRCUITS, SHIFT REGISTER UNITS AND DRIVING METHODS THEREOF

(71) Applicants: Hefei BOE Joint Technology Co., Ltd., Anhui (CN); BOE Technology Group Co., Ltd., Beijing (CN)

(72) Inventors: Xuehuan Feng, Beijing (CN); Yongqian Li, Beijing (CN)

(73) Assignees: Hefei BOE Joint Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/556,652

(22) Filed: Dec. 20, 2021

(65) Prior Publication Data

US 2022/0309978 A1    Sep. 29, 2022

(30) Foreign Application Priority Data

Mar. 29, 2021  (CN) .......................... 202110336521.4

(51) Int. Cl.
*G09G 3/20* (2006.01)
*G11C 19/28* (2006.01)

(52) U.S. Cl.
CPC ............. *G09G 3/20* (2013.01); *G11C 19/28* (2013.01); *G09G 2310/0267* (2013.01); *G09G 2310/061* (2013.01); *G09G 2310/08* (2013.01); *G09G 2320/0209* (2013.01); *G09G 2320/0252* (2013.01)

(58) Field of Classification Search
CPC ............. G09G 3/20; G09G 2310/0267; G09G 2310/061; G09G 2310/08; G09G 2320/0209; G09G 2320/0252; G11C 19/28
See application file for complete search history.

(56) References Cited

U.S. PATENT DOCUMENTS

2020/0051656 A1*  2/2020  Feng .................... G11C 19/287

* cited by examiner

*Primary Examiner* — Gerald Johnson
(74) *Attorney, Agent, or Firm* — IPro, PLLC

(57) ABSTRACT

The present disclosure provides display apparatuses, gate drive circuits, shift register units and driving methods thereof. The shift register unit includes: an outputting module, configured to output a composite output signal under a control of a potential of a pull-up node; a pull-up module, configured to charge the pull-up node under a control of a display control signal terminal and charge the pull-up node under a control of a potential of a black insertion node; a first reset circuit configured to, under a control of the reset signal terminal and the potential of the black insertion node, control a voltage control node to communicate with the pull-up node; a current-limiting circuit, connected between the voltage control node and a first voltage terminal; and a charging module, configured to charge the voltage control node under the control of the potential of the pull-up node.

20 Claims, 11 Drawing Sheets

DISPLAY APPARATUSES, GATE DRIVE CIRCUITS, SHIFT REGISTER UNITS AND DRIVING METHODS THEREOF

CROSS REFERENCE TO RELATED APPLICATIONS

This application claims priority to Chinese Patent Application No. 202110336521.4 entitled "DISPLAY APPARATUSES, GATE DRIVE CIRCUITS, SHIFT REGISTER UNITS AND DRIVING METHODS THEREOF" filed on Mar. 29, 2021, the entire content of which is incorporated herein by reference.

TECHNICAL FIELD

The present disclosure relates to the field of display technologies, and in particular to display apparatuses, gate drive circuits, shift register units and driving methods thereof.

BACKGROUND

In the field of display technologies, image smear may occur during a switching process of motion picture. In order to solve the problem of image smear, a black picture is usually inserted in a display stage. But, the existing gate drive circuits cannot control a pixel circuit to achieve the black insertion/black frame insertion function.

SUMMARY

The object of the present disclosure is to provide display apparatuses, gate drive circuits, shift register units and driving methods thereof to control a pixel circuit to achieve a black insertion function.

According to an aspect of the present disclosure, there is provided a shift register unit, including: an outputting module, connected with a pull-up node and configured to output a composite output signal under a control of a potential of the pull-up node; a pull-up module, connected with a display control signal terminal, a black insertion node and the pull-up node, and configured to charge the pull-up node under a control of the display control signal terminal and charge the pull-up node under a control of a potential of the black insertion node; a reset and leakage prevention composite module, comprising a first reset circuit and a current-limiting circuit, where the first reset circuit is connected with a reset signal terminal, a voltage control node, the black insertion node and the pull-up node and is configured to, under a control of the reset signal terminal and the potential of the black insertion node, control the voltage control node to communicate with the pull-up node; the current-limiting circuit is connected between the voltage control node and a first voltage terminal; and a charging module, connected with the voltage control node and the pull-up node and configured to charge the voltage control node under the control of the potential of the pull-up node.

In an embodiment, the current-limiting circuit is connected with the black insertion node and is configured to, under the control of the potential of the black insertion node, control the first voltage terminal to communicate with the voltage control node.

In an embodiment, the current-limiting circuit includes: a leakage prevention transistor, where a control pole of the leakage prevention transistor is connected with the black insertion node, a first pole of the leakage prevention transistor is connected with the voltage control node, and a second pole of the leakage prevention transistor is connected with the first voltage terminal.

In an embodiment, the current-limiting circuit includes: an auxiliary reset transistor, where a control pole of the auxiliary reset transistor is connected with the reset signal terminal, and a first pole of the auxiliary reset transistor is connected with the voltage control node; and a leakage prevention transistor, where a control pole of the leakage prevention transistor is connected with the black insertion node, a first pole of the leakage prevention transistor is connected with a second pole of the auxiliary reset transistor, and a second pole of the leakage prevention transistor is connected with the first voltage terminal.

In an embodiment, the current-limiting circuit includes: a current-limiting transistor, where a control pole and a first pole of the current-limiting transistor are both connected with the voltage control node, a second pole of the current-limiting transistor is connected with the first voltage terminal, and the current-limiting transistor is configured to turn on when a potential of the first pole of the current-limiting transistor is greater than a potential of the second pole of the current-limiting transistor.

In an embodiment, the shift register unit further includes: a black insertion node controlling module, connected with the black insertion node, a first charge node and a clock signal terminal, and configured to charge the first charge node under a control of the clock signal terminal and control the first charge node to communicate with the black insertion node under the control of the clock signal terminal; and the charging module is further connected with the first charge node and the black insertion node and is configured to, under a control of the potentials of the black insertion node and the pull-up node, control the first charge node to communicate with the voltage control node.

In an embodiment, the shift register unit further includes: a compensating module, comprising a compensation control circuit and a compensation output circuit, where the compensation control circuit is connected with the display control signal terminal, a compensation control signal terminal, a second charge node and a compensation node and is configured to, under a control of the compensation control signal terminal, control the display control signal terminal to communicate with the second charge node, and under the control of the compensation control signal terminal, control the compensation node to communicate with the second charge node; and the compensation output circuit is connected with the compensation node, a clock signal terminal and the pull-up node, and is configured to charge the pull-up node under a control of the compensation node and the clock signal terminal.

In an embodiment, the charging module is further connected with the second charge node and the compensation node and is configured to, under a control of the compensation node and the potential of the pull-up node, control the second charge node to communicate with the voltage control node.

In an embodiment, the pull-up module includes: a display input circuit, connected with the display control signal terminal, the pull-up node and the voltage control node and configured to, under the control of the display control signal terminal, charge the voltage control node, and under the control of the display control signal terminal, control the voltage control node to communicate with the pull-up node.

According to an aspect of the present disclosure, there is provided a gate drive circuit, including a plurality of cascaded shift register units described above.

According to an aspect of the present disclosure, there is provided a display apparatus including the above gate drive circuit.

According to an aspect of the present disclosure, there is provided a driving method of a shift register unit, the method is applicable to the above shift register units. The driving method includes: enabling the outputting module to output a composite output signal under the control of the potential of the pull-up node; enabling the pull-up module to charge the pull-up node under the control of the display control signal terminal and charge the pull-up node under the control of the potential of the black insertion node; enabling the first reset circuit to control the voltage control node to communicate with the pull-up node under the control of the reset signal terminal and the potential of the black insertion node; and enabling the charging module to charge the voltage control node under the control of the potential of the pull-up node.

DETAILED DESCRIPTION

Figure 1:
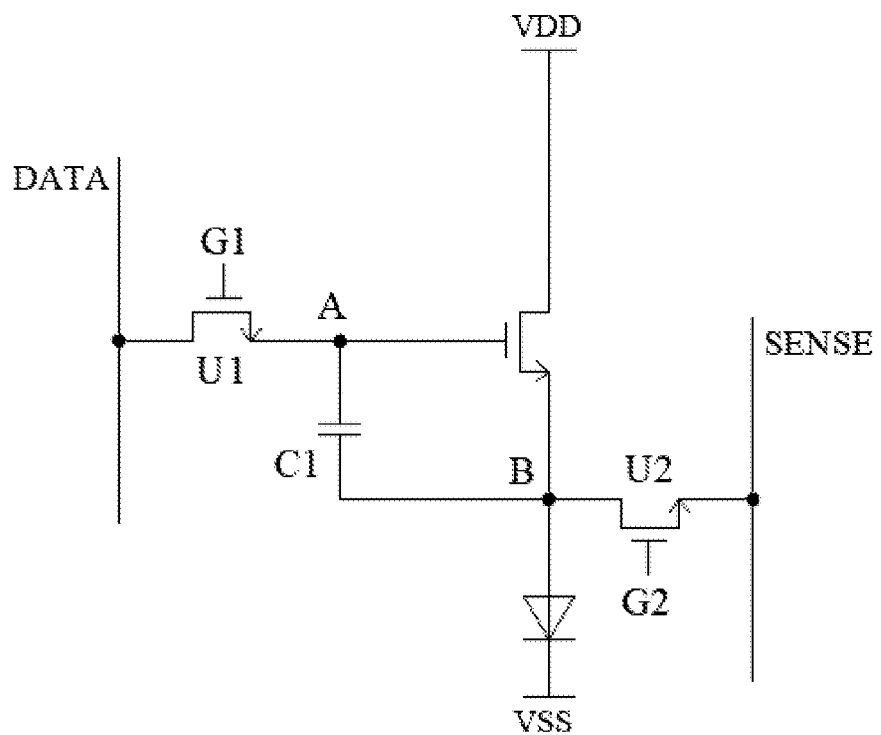
FIG. 1 is a schematic diagram illustrating a pixel circuit according to an embodiment of the present disclosure.

Exemplary embodiments will be described in detail herein, with the illustrations thereof represented in the drawings. When the following descriptions involve the drawings, like numerals in different drawings refer to like or similar elements unless otherwise indicated. The embodiments described in the following examples do not represent all embodiments consistent with the present disclosure. Rather, they are merely examples of apparatuses and methods consistent with some aspects of the present disclosure as detailed in the appended claims.

Terms used herein are used to only describe a particular embodiment rather than limit the present disclosure. Unless otherwise defined, technical terms or scientific terms used in the present disclosure should have general meanings that can be understood by ordinary persons of skill in the art. "First" "second" and the like used in the specification and claims do not represent any sequence, quantity or importance, but distinguish different components. Similarly, "one" or "a" and the like do not represent quantity limitation but represent at least one. "Multiple" or "a plurality" represents two or more. Unless otherwise stated, "include" or "contain" or the like is intended to refer to that an element or object appearing before "include" or "contain" covers an element or object or its equivalents listed after "include" or "contain" and does not preclude other elements or objects. "Connect" or "connect with" or the like is not limited to physical or mechanical connection but includes direct or indirect electrical connection. The singular forms such as "a", 'said", and "the" used in the present disclosure and the appended claims are also intended to include multiple, unless the context clearly indicates otherwise. It is also to be understood that the term "and/or" as used herein refers to and includes any or all possible combinations of one or more associated listed items.

The transistors employed in the present disclosure may be triodes, thin-film transistors or field effect transistors or other devices having the same characteristics. In one or more embodiments of the present disclosure, in order to distinguish two poles other than a control pole in a transistor, one of the two poles is referred to as a first pole and the other is referred to as a second pole.

In an embodiment, when the transistor is a triode, the control pole may be a base electrode, the first pole may be a collector electrode and the second pole may be an emitter electrode; alternatively, the control pole may be a base electrode, the first pole may be an emitter electrode and the second pole may be a collector electrode.

In another embodiment, when the transistor is a thin-film transistor or a field effect transistor, the control pole may be a gate electrode, the first pole may be a drain electrode, and the second pole may be a source electrode; alternatively, the control pole may be a gate electrode, the first pole may be a source electrode and the second pole may be a drain electrode.

Figure 2:
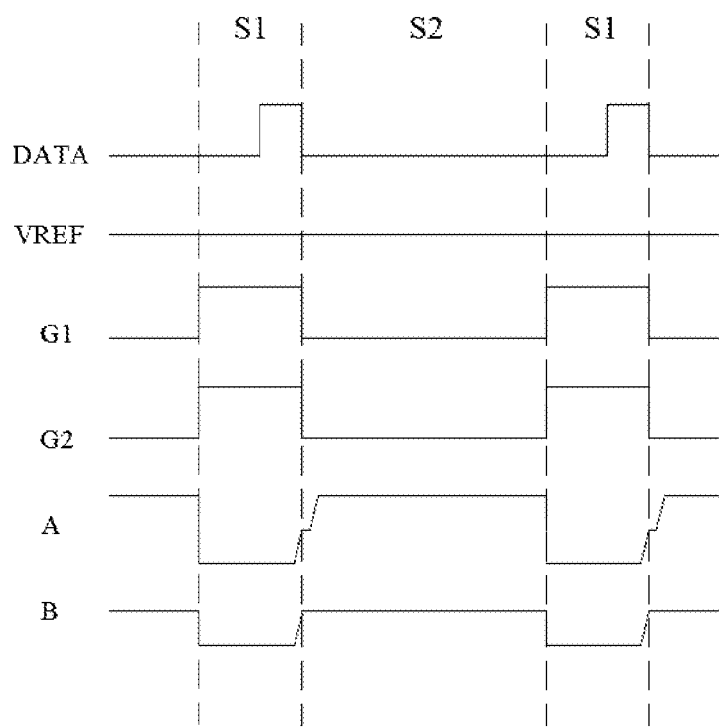
FIG. 2 is a time sequence diagram of the pixel circuit of FIG. 1.

In an embodiment of the present disclosure, as shown in FIGS. 1 and 2, in a data write stage S1 of a pixel circuit, a data write transistor U1 and a sensing transistor U2 are turned on simultaneously to write data of the DATA. In a light emission stage S2, the data write transistor U1 and the sensing transistor U2 are turned off, a node A is bootstrapped through a capacitor C1, and pixels start to emit light until the next data write stage.

Figure 3:
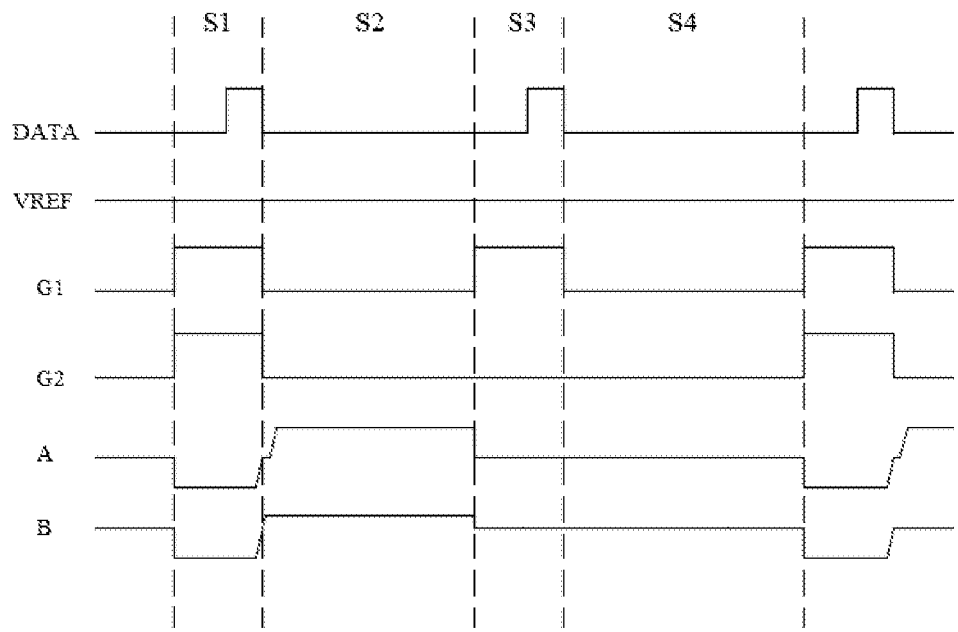
FIG. 3 is another time sequence diagram of the pixel circuit of FIG. 1.

As shown in FIGS. 1 and 3, in the data write stage S1, the data write transistor U1 and the sensing transistor U2 are turned on simultaneously to write the data of the DATA. In the light emission stage S2, the data write transistor U1 and the sensing transistor U2 are turned off, the node A is bootstrapped through the capacitor C1, and pixels start to emit light. In a black data write stage S3, the data write transistor U1 is turned on and the node A writes black data. In a black picture stage S4, pixels stop emitting light and switch to a black picture until the next data write stage. Compared with the time sequence of FIG. 2, when the time sequence of FIG. 3 is adopted, a black picture switching process is provided in the light emission period of the pixel circuit so as to reduce a light emission time and increase a moving picture response time (MPRT), thereby solving the problem of image smear.

Figure 4:
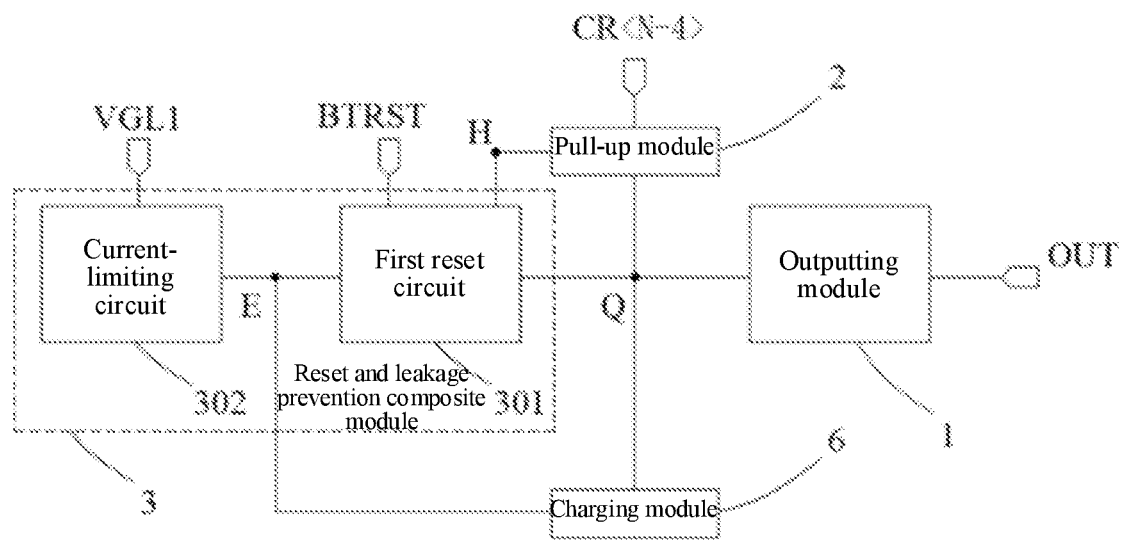
FIG. 4 is a schematic diagram illustrating a shift register unit according to an embodiment of the present disclosure.

One or more embodiments of the present disclosure provide a shift register unit. As shown in FIG. 4, the shift register unit may include an outputting module 1, a pull-up module 2, a charging module 6 and a reset and leakage prevention composite module 3.

The outputting module 1 is connected with a pull-up node Q and is configured to under the control of a potential of the pull-up node Q, output a composite output signal. The pull-up module 2 is connected with a display control signal terminal CR<N−4>, a black insertion node H and the pull-up node Q, and is configured to charge the pull-up node Q under the control of the display control signal terminal CR<N−4>, and charge the pull-up node Q under the control of a potential of the black insertion node H. The reset and leakage prevention composite module 3 includes a first reset circuit 301 and a current-limiting circuit 302. The first reset circuit 301 is connected with a reset signal terminal BTRST, a voltage control node E, the black insertion node H and the pull-up node Q, and is configured to, under the control of the reset signal terminal BTRST and the potential of the black insertion node H, control the voltage control node E to communicate with the pull-up node Q. And the current-limiting circuit 302 is connected between the voltage control node E and a first voltage terminal VGL1. The charging module 6 is connected with the voltage control node E and the pull-up node Q, and is configured to charge the voltage control node E under the control of the potential of the pull-up node Q.

In one or more embodiments of the present disclosure, in a use process of the shift register unit, an output terminal of the outputting module 1 is connected with a gate electrode of the data write transistor U1 (shown in FIG. 1) of the above pixel circuit. Because the pull-up module 2 can charge the pull-up node Q under the control of the potential of the black insertion node H, the outputting module 1 can thus control the pixel circuit to achieve black insertion function under the control of the potential of the charged pull-up node Q. The current-limiting circuit 302 may limit a current between the voltage control node E and the first voltage terminal VGL1, and hence a current between the pull-up node Q and the first voltage terminal VGL1 can be limited to prevent electric leakage of the pull-up node Q.

Various parts of the shift register unit of the embodiments of the present disclosure will be detailed below.

Figure 5:
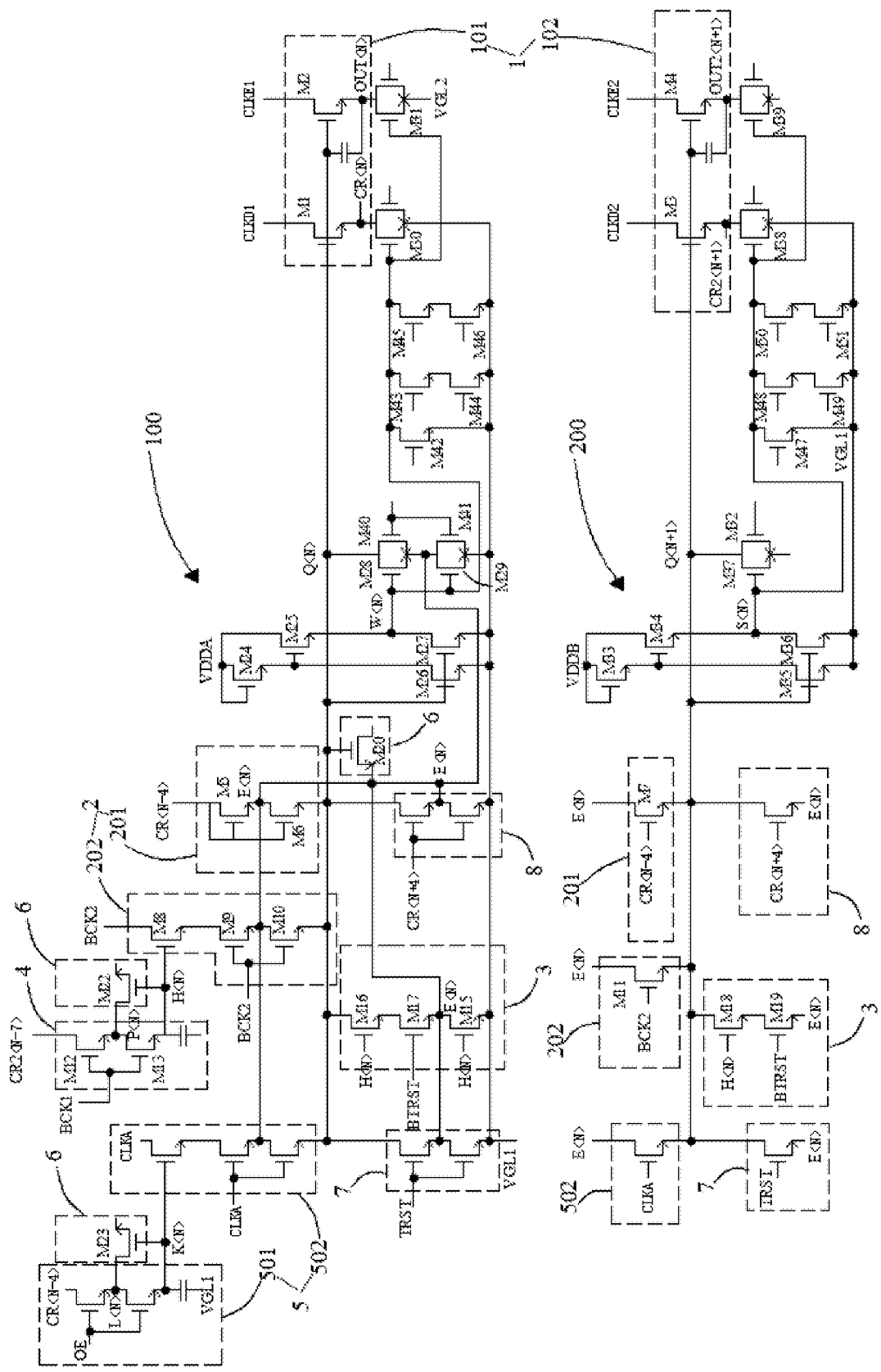
FIG. 5 is a schematic diagram illustrating a shift register unit with a leakage prevention transistor according to an embodiment of the present disclosure.

As shown in FIG. 5, the outputting module 1 may include a first output circuit 101 and a second output circuit 102. The pull-up node Q may include a first pull-up node Q<N> and a second pull-up node Q<N+1>. The first output circuit 101 is connected with the first pull-up node Q<N> and is configured to output a first composite output signal under the control of a potential of the first pull-up node Q<N>. The first output circuit 101 may include a first cascading signal output terminal CR<N> and a first pixel scanning signal output terminal OUT<N>. The first output circuit 101 may be connected with a clock signal terminal. The first output circuit 101 is configured to, under the control of the potential of the first pull-up node Q<N>, control the clock signal terminal to communicate with the first cascading signal output terminal CR<N>. The first output circuit 101 is further configured to, under the control of the potential of the first pull-up node Q<N>, control the clock signal terminal to communicate with the first pixel scanning signal output terminal OUT<N>. For example, the first output circuit 101 may include a first output transistor M1 and a second output transistor M2. A gate electrode of the first output transistor M1 and a gate electrode of the second output transistor M2 are both connected with the first pull-up node Q<N>. A first pole of the first output transistor M1 is connected with a clock signal terminal CLKD1, and a second pole of the first output transistor M1 is connected with the first cascading signal output terminal CR<N>. A first pole of the second output transistor M2 is connected with a clock signal terminal CLKE1, and a second pole of the second output transistor M2 is connected with the first pixel scanning signal output terminal OUT<N>.

As shown in FIG. 5, the second output circuit 102 is connected with the second pull-up node Q<N+1>, and is configured to output a second composite output signal under the control of a potential of the second pull-up node Q<N+1>. The second output circuit 102 may include a second cascading signal output terminal CR2<N+1> and a second pixel scanning signal output terminal OUT2<N+1>. The second output circuit 102 may also be connected with the clock signal terminal. The second output circuit 102 is configured to, under the control of a potential of the second pull-up node Q<N+1>, control the clock signal terminal to communicate with the second cascading signal output terminal CR2<N+1>. The second output circuit 102 is configured to, under the control of the potential of the second pull-up node Q<N+1>, control the clock signal terminal to communicate with the second pixel scanning signal output terminal OUT2<N+1>. For example, the second output circuit 102 may include a third output transistor M3 and a fourth output transistor M4. A gate electrode of the third output transistor M3 and a gate electrode of the fourth output transistor M4 are both connected with the second pull-up node Q<N+1>. A first pole of the third output transistor M3 is connected with a clock signal terminal CLKD2, and a second pole of the third output transistor M3 is connected with the second cascading signal output terminal CR2<N+1>. A first pole of the fourth output transistor M4 is connected with a clock signal terminal CLKE2, and a second pole of the fourth output transistor M4 is connected with the second pixel scanning signal output terminal OUT2<N+1>.

As shown in FIG. 5, the pull-up module 2 may include a display input circuit 201 and a black insertion input circuit 202. The display input circuit 201 is connected with a display control signal terminal CR<N−4>, the first pull-up node Q<N> and the second pull-up node Q<N+1>, and is configured to control the display control signal terminal CR<N−4> to communicate with the first pull-up node Q<N> and the second pull-up node Q<N+1> to charge the first pull-up node Q<N> and the second pull-up node Q<N+1> under the control of the display control signal terminal CR<N−4>. The display input circuit 201 may also be connected with a voltage control node E<N>, and be configured to charge the voltage control node E<N> under the control of the display control signal terminal CR<N−4>, and under the control of the display control signal terminal CR<N−4>, control the voltage control node E<N> to communicate with the first pull-up node Q<N> and the second pull-up node Q<N+1> to charge the first pull-up node Q<N> and the second pull-up node Q<N+1>. For example, the display input circuit 201 may include a first display control transistor M5, a second display control transistor M6 and a third display control transistor M7. A control pole and a first pole of the first display control transistor M5, a control pole of the second display control transistor M6 and a control pole of the third display control transistor M7 are all connected with the display control signal terminal CR<N−4>. A second pole of the first display control transistor M5, a first pole of the second display control transistor M6 and a first pole of the third display control transistor M7 are all connected with the voltage control node E<N>. A second pole of the second display control transistor M6 is connected with the first pull-up node Q<N>, and a second pole of the third display control transistor M7 is connected with the second pull-up node Q<N+1>.

As shown in FIG. 5, the black insertion input circuit 202 is connected with a black insertion node H<N>, the first pull-up node Q<N> and the second pull-up node Q<N+1> and is configured to, under the control of a potential of the black insertion node H<N>, charge the first pull-up node Q<N> and the second pull-up node Q<N+1>. Further, the black insertion input circuit 202 is also connected with the clock signal terminal and is configured to, under the control of the clock signal terminal and the potential of the black insertion node H<N>, control the clock signal terminal to communicate with the first pull-up node Q<N> and the second pull-up node Q<N+1> to charge the first pull-up node Q<N> and the second pull-up node Q<N+1>. For example, the black insertion input circuit 202 may include a first black insertion input transistor M8, a second black insertion input transistor M9, a third black insertion input transistor M10 and a fourth black insertion input transistor M11. A first pole of the first black insertion input transistor M8, a control pole of the second black insertion input transistor M9, a control pole of the third black insertion input transistor M10 and a control pole of the fourth black insertion input transistor M11 are all connected with a clock signal terminal BCK2. A control pole of the first black insertion input transistor M8 is connected with the black insertion node H<N>, and a second pole of the first black insertion input transistor M8 is connected with a first pole of the second black insertion input transistor M9. A second pole of the third black insertion input transistor M10 is connected with the first pull-up node Q<N>, and a second pole of the fourth black insertion input transistor M11 is connected with the second pull-up node Q<N+1>. A second pole of the second black insertion input transistor M9, a first pole of the third black insertion input transistor M10 and a first pole of the fourth black insertion input transistor M11 are all connected with the voltage control node E<N>.

As shown in FIG. 5, the shift register unit according to the present disclosure may further include a black insertion node controlling module 4. The black insertion node controlling module 4 is connected with the black insertion node H<N>, a first charge node P<N> and the clock signal terminal, and is configured to under the control of the clock signal terminal, charge the first charge node P<N> and under the control of the clock signal terminal, control the first charge node P<N> to communicate with the black insertion node H<N>. The black insertion node controlling module 4 is further connected with a black insertion control signal terminal CR2<N−7> and is configured to, under the control of the clock signal terminal, control the black insertion control signal terminal CR2<N−7> to communicate with the first charge node P<N>. For example, the black insertion node controlling module 4 may include a first black insertion control transistor M12 and a second black insertion control transistor M13. A control pole of the first black insertion control transistor M12 and a control pole of the second black insertion control transistor M13 are both connected with a clock signal terminal BCK1, and a first pole of the first black insertion control transistor M12 is connected with the black insertion control signal terminal CR2<N−7>. A second pole of the first black insertion control transistor M12 and a first pole of the second black insertion control transistor M13 are both connected with the first charge node P<N>, and a second pole of the second black insertion control transistor M13 is connected with the black insertion node H<N>. The black insertion node controlling module 4 may further include an energy storage capacitor for maintaining the potential of the black insertion node H<N>.

As shown in FIG. 5, the reset and leakage prevention composite module 3 includes the first reset circuit 301 (shown in FIG. 4) and the current-limiting circuit 302 (shown in FIG. 4). The first reset circuit 301 is connected with the reset signal terminal BTRST, the voltage control node E<N>, the black insertion node H<N>, the first pull-up node Q<N>, the second pull-up node Q<N+1> and the first voltage terminal VGL1 and is configured to, under the control of the reset signal terminal BTRST and the potential of the black insertion node H<N>, control the voltage control node E<N> to communicate with the first pull-up node Q<N> and the second pull-up node Q<N+1>. The first voltage terminal VGL1 may be a low voltage terminal. For example, the first reset circuit 301 may include a first reset transistor M16, a second reset transistor M17, a third reset transistor M18, and a fourth reset transistor M19. A control pole of the first reset transistor M16 and a control pole of the third reset transistor M18 are both connected with the black insertion node H<N>, and a control pole of the second reset transistor M17 and a control pole of the fourth reset transistor M19 are both connected with the reset signal terminal BTRST. A first pole of the first reset transistor M16 is connected with the first pull-up node Q<N>, and a second pole of the first reset transistor M16 is connected with a first pole of the second reset transistor M17. A second pole of the second reset transistor M17 is connected with the voltage control node E<N>. A first pole of the third reset transistor M18 is connected with the second pull-up node Q<N+1>, a second pole of the third reset transistor M18 is connected with a first pole of the fourth reset transistor M19, and a second pole of the fourth reset transistor M19 is connected with the voltage control node E<N>.

As shown in FIG. 5, the current-limiting circuit 302 is connected between the voltage control node E<N> and the first voltage terminal VGL1. In an embodiment of the present disclosure, the current-limiting circuit 302 is configured to, under the control of the potential of the black insertion node H<N>, control the first voltage terminal VGL1 to communicate with the voltage control node E<N>. In this case, when the above pull-up module 2 charges the first pull-up node Q<N> and the second pull-up node Q<N+1> under the control of the display control signal terminal CR<N−4>, because the potential of the black insertion node H<N> is not sufficient to conduct the current-limiting circuit 302, the first voltage terminal VGL1 and the voltage control node E<N> are disconnected. In this way, the decrease of the potential of the voltage control node E<N> is avoided and the problem of electric leakage of the first pull-up node Q<N> and the second pull-up node Q<N+1> resulting from the decrease of the potential of the voltage control node E<N> is solved. For example, the current-limiting circuit 302 may include a leakage prevention transistor M15. A control pole of the leakage prevention transistor M15 is connected with the black insertion node H<N>, a first pole of the leakage prevention transistor M15 is connected with the voltage control node E<N>, and a second pole of the leakage prevention transistor M15 is connected with the first voltage terminal VGL1.

Figure 6:
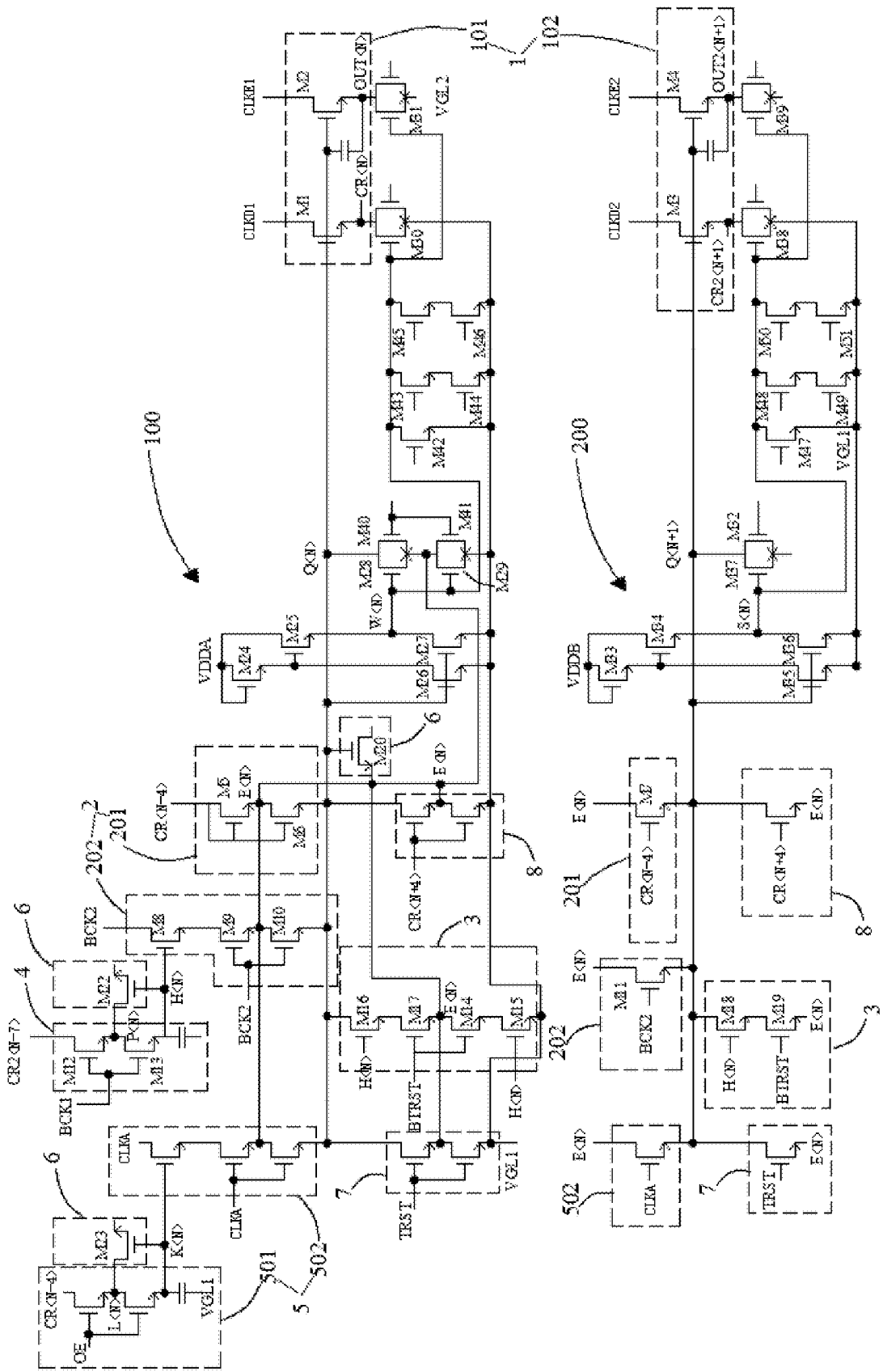
FIG. 6 is another schematic diagram illustrating a shift register unit with a leakage prevention transistor according to an embodiment of the present disclosure.

As shown in FIG. 6, in another embodiment of the present disclosure, the current-limiting circuit 302 is configured to, under the control of the potential of the black insertion node H<N> and the reset signal terminal BTRST, control the first voltage terminal VGL1 to communicate with the voltage control node E<N>. For example, the current-limiting circuit 302 may include an auxiliary reset transistor M14, and a leakage prevention transistor M15. A control pole of the auxiliary reset transistor M14 is connected with the reset signal terminal BTRST, and a first pole of the auxiliary reset transistor M14 is connected with the voltage control node E<N>. A control pole of the leakage prevention transistor M15 is connected with the black insertion node H<N>, a first pole of the leakage prevention transistor M15 is connected with a second pole of the auxiliary reset transistor M14, and a second pole of the leakage prevention transistor M15 is connected with the first voltage terminal VGL1.

Figure 13:
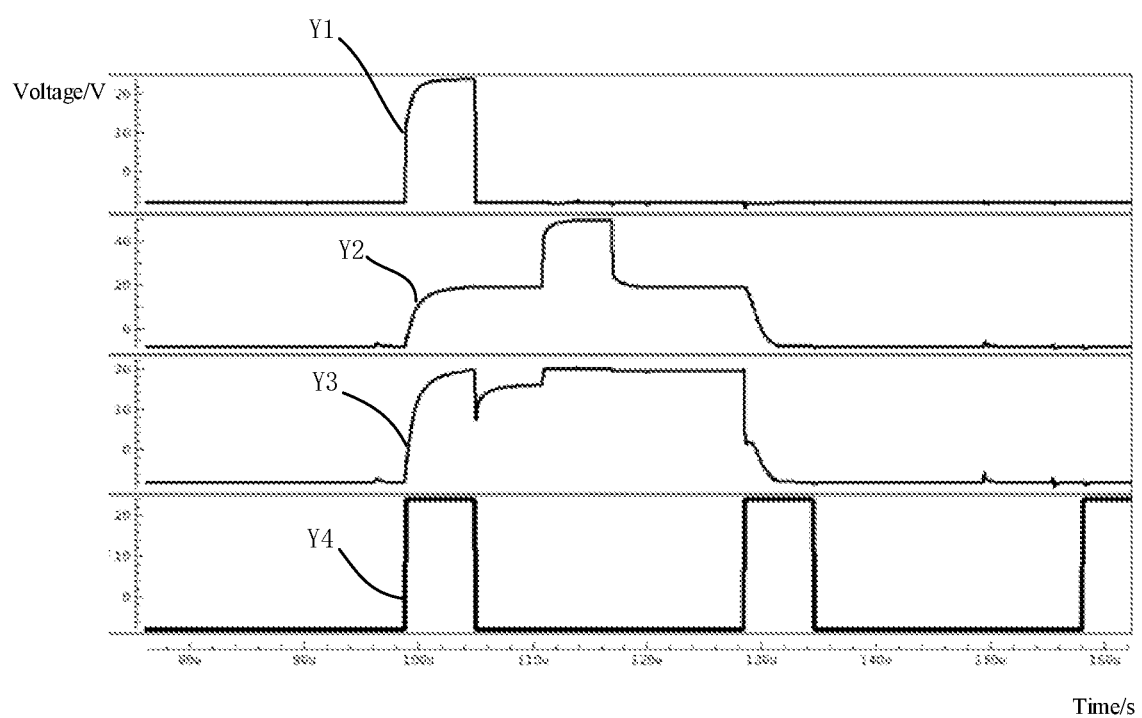
FIG. 13 is a simulation diagram of a shift register unit according to an embodiment of the present disclosure.

FIG. 13 is a simulation diagram of a shift register unit having a current-limiting circuit 302 according to an embodiment of the present disclosure. As shown in FIG. 13, output signals of the display control signal terminal CR<N−4> are shown as curve Y1, the potential of the first pull-up node Q<N> is shown as curve Y2, the potential of the voltage control node E<N> is shown as curve Y3, and output signals of the reset signal terminal BTRST are shown as curve Y4. It can be known from FIG. 13 that the current-limiting circuit 302 disposed herein can effectively prevent electric leakage of the first pull-up node Q<N>.

Figure 7:
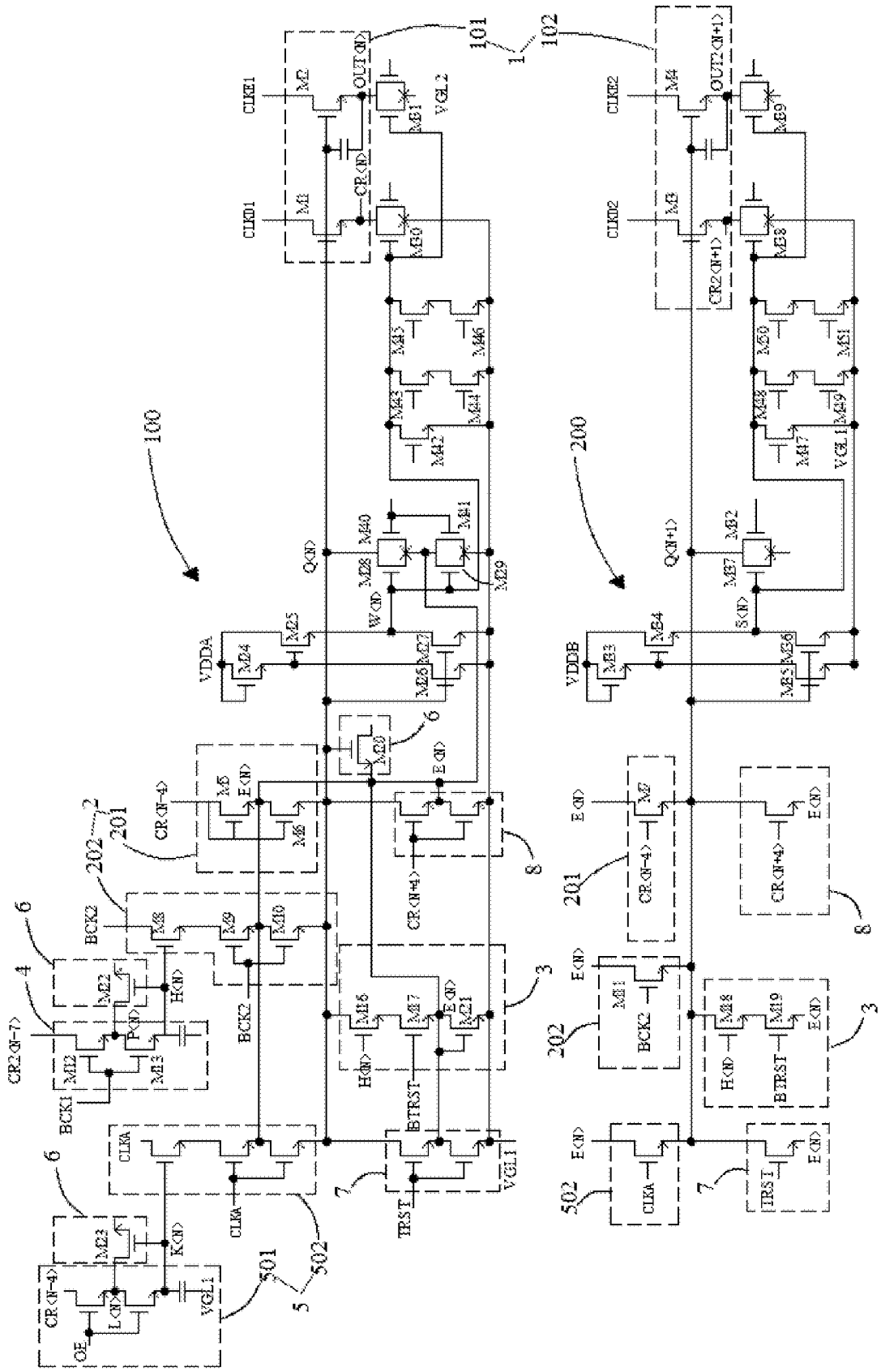
FIG. 7 is a schematic diagram illustrating a shift register unit with a current-limiting transistor according to an embodiment of the present disclosure.
Figure 8:
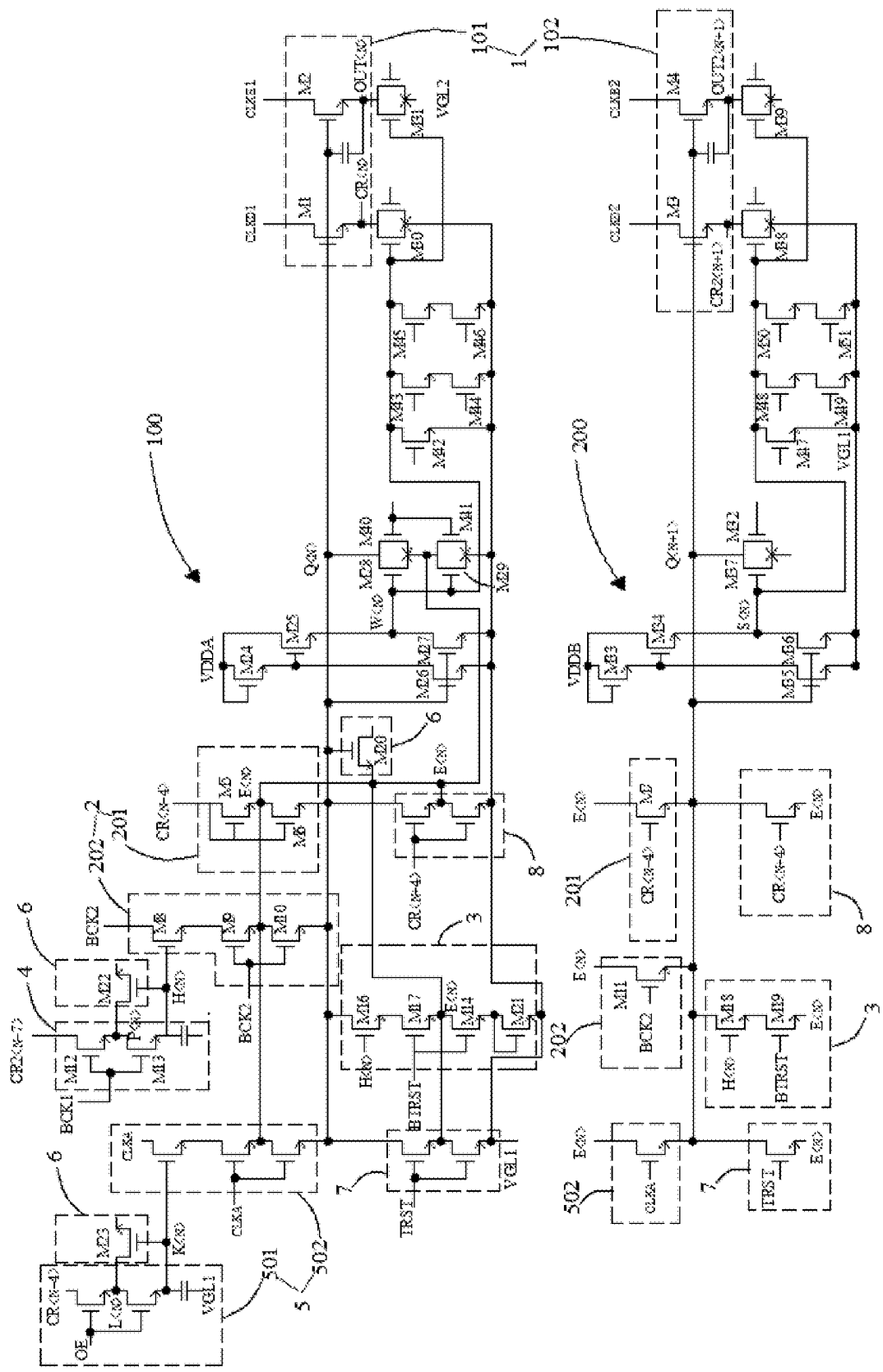
FIG. 8 is another schematic diagram illustrating a shift register unit with a current-limiting transistor according to an embodiment of the present disclosure.

As shown in FIG. 7, in other embodiments of the present disclosure, the current-limiting circuit 302 may include a current-limiting transistor M21. A control pole and a first pole of the current-limiting transistor M21 are both connected with the voltage control node E<N>, and a second pole of the current-limiting transistor M21 is connected with the first voltage terminal VGL1. The second pole of the current-limiting transistor M21 is an output terminal of the current-limiting transistor M21, namely, the current-limiting transistor M21 turns on when a potential of the first pole of the current-limiting transistor M21 is greater than a potential of the second pole of the current-limiting transistor M21. Alternatively, as shown in FIG. 8, the control pole and the first pole of the current-limiting transistor M21 may both be connected with the second pole of the auxiliary reset transistor M14, the control pole of the auxiliary reset transistor M14 is connected with the reset signal terminal BTRST, and the first pole of the auxiliary reset transistor M14 is connected with the voltage control node E<N>.

As shown in FIG. 5, the charging module 6 is connected with the voltage control node E<N> and the first pull-up node Q<N>, and is configured to charge the voltage control node E<N> under the control of the potential of the first pull-up node Q<N>. The charging module 6 may include a first charge transistor M20 and a second charge transistor M22. A control pole of the first charge transistor M20 is connected with the first pull-up node Q<N>, a first pole of the first charge transistor M20 is connected with the voltage control node E<N>, a second pole of the first charge transistor M20 is connected with a second pole of the second charge transistor M22, a first pole of the second charge transistor M22 is connected with the above first charge node P<N>, and a control pole of the second charge transistor M22 is connected with the black insertion node H<N>.

As shown in FIG. 5, the shift register unit of the present disclosure may further include a compensating module 5. The compensating module 5 may include a compensation control circuit 501 and a compensation output circuit 502. The compensation control circuit 501 may be connected with the display control signal terminal CR<N−4>, a compensation control signal terminal OE, a second charge node L<N> and a compensation node K<N> and be configured to, under the control of the compensation control signal terminal OE, control the display control signal terminal CR<N−4> to communicate with the second charge node L<N>, and under the control of the compensation control signal terminal OE, control the compensation node K<N> to communicate with the second charge node L<N>. The compensation output circuit 502 is connected with the compensation node K<N> and a clock signal terminal CLKA and is configured to, under the control of the compensation node K<N> and the clock signal terminal CLKA, control the clock signal terminal CLKA to communicate with the first pull-up node Q<N> to charge the first pull-up node Q<N>. The above charging module 6 is further connected with the second charge node L<N> and the compensation node K<N> and is configured to, under the control of the compensation node K<N> and the first pull-up node Q<N>, control the second charge node L<N> to communicate with the voltage control node E<N>. In an example, the above charging module 6 may further include a third charge transistor M23. A control pole of the third charge transistor M23 is connected with the compensation node K<N>, a first pole of the third charge transistor M23 is connected with the second charge node L<N>, and a second pole of the third charge transistor M23 is connected with the second pole of the above first charge transistor M20.

As shown in FIG. 5, the shift register unit of the present disclosure may further include a global resetting module 7. The global resetting module 7 is connected with the first pull-up node Q<N>, the second pull-up node Q<N+1>, the first voltage terminal VGL1 and a global reset signal terminal TRST and is configured to, under the control of the global reset signal terminal TRST, control the first voltage terminal VGL1 to communicate with the first pull-up node Q<N> and the second pull-up node Q<N+1>.

As shown in FIG. 5, the shift register unit of the present disclosure may further include a display resetting module 8. The display resetting module 8 is connected with a display reset signal terminal CR<N+4>, the first pull-up node Q<N>, the second pull-up node Q<N+1> and the first voltage terminal VGL1 and is configured to, under the control of the display reset signal terminal CR<N+4>, control the first voltage terminal VGL1 to communicate with the first pull-up node Q<N> and the second pull-up node Q<N+1>.

As shown in FIG. 5, the shift register unit of the present disclosure may further include a first pull-down control circuit and a first pull-down circuit. The first pull-down control circuit is connected with the first voltage terminal VGL1 and a second voltage terminal VDDA, and is configured to control a potential of a first pull-down node W<N> under the control of the potential of the first pull-up node Q<N>. The first pull-down circuit is connected with the first voltage terminal VGL1 and a third voltage terminal VGL2 and is configured to, under the control of the potential of the first pull-down node W<N>, perform pull-down resetting for the first pull-up node Q<N>, the second pull-up node Q<N+1>, the above first output terminal (for example, the first cascading signal output terminal CR<N> and/or the first pixel scanning signal output terminal OUT<N>) and the above second output terminal (for example, the second cascading signal output terminal CR2<N+1> and/or the second pixel scanning signal output terminal OUT2<N+1>). The second voltage terminal VDDA may be a high voltage terminal. For example, the first pull-down control circuit may include a first pull-down control transistor M24, a second pull-down control transistor M25, a third pull-down control transistor M26 and a fourth pull-down control transistor M27. A control pole and a first pole of the first pull-down control transistor M24 and a first pole of the second pull-down control transistor M25 are all connected with the second voltage terminal VDDA, and a second pole of the first pull-down control transistor M24 and a control pole of the second pull-down control transistor M25 are both connected with a first pole of the third pull-down control transistor M26. A control pole of the third pull-down control transistor M26 and a control pole of the fourth pull-down control transistor M27 are both connected with the first pull-up node Q<N>, a second pole of the third pull-down control transistor M26 and a second pole of the fourth pull-down control transistor M27 are both connected with the first voltage terminal VGL1, and a first pole of the fourth pull-down control transistor M27 and a second pole of the second pull-down control transistor M25 are both connected with the first pull-down node W<N>. The first pull-down circuit may include a first pull-down transistor M28, a second pull-down transistor M29, a third pull-down transistor M30, a fourth pull-down transistor M31 and a fifth pull-down transistor M32. Control poles of the first pull-down transistor M28, the second pull-down transistor M29, the third pull-down transistor M30, the fourth pull-down transistor M31 and the fifth pull-down transistor M32 are all connected with the first pull-down node W<N>. A first pole of the first pull-down transistor M28 is connected with the first pull-up node Q<N>, a second pole of the first pull-down transistor M28 and a first pole of the second pull-down transistor M29 are both connected with the above voltage control node E<N>, and a second pole of the second pull-down transistor M29 and a second pole of the third pull-down transistor M30 are both connected with the first voltage terminal VGL1. A first pole of the third pull-down transistor M30 is connected with the above first cascading signal output terminal CR<N>, a first pole of the fourth pull-down transistor M31 is connected with the above first pixel scanning signal output terminal OUT<N>, and a second pole of the fourth pull-down transistor M31 is connected with the third voltage terminal VGL2. A first pole of the fifth pull-down transistor M32 is connected with the second pull-up node Q<N+1>, and a second pole of the fifth pull-down transistor M32 is connected with the voltage control node E<N>.

As shown in FIG. 5, the shift register unit of the present disclosure may further include a second pull-down control circuit and a second pull-down circuit. The second pull-down control circuit is connected with the first voltage terminal VGL1 and a fourth voltage terminal VDDB and is configured to, under the control of the potential of the second pull-up node Q<N+1>, control a potential of a second pull-down node S<N>. The second pull-down circuit is connected with the first voltage terminal VGL1 and the third voltage terminal VGL2 and is configured to, under the control of the potential of the second pull-down node S<N>, perform pull-down resetting for the first pull-up node Q<N>, the second pull-up node Q<N+1>, the above first output terminal (for example, the first cascading signal output terminal CR<N> and/or the first pixel scanning signal output terminal OUT<N>) and the above second output terminal (for example, the second cascading signal output terminal CR2<N+1> and/or the second pixel scanning signal output terminal OUT2<N+1>). For example, the second pull-down control circuit may include a fifth pull-down control transistor M33, a sixth pull-down control transistor M34, a seventh pull-down control transistor M35 and an eighth pull-down control transistor M36. A control pole and a first pole of the fifth pull-down control transistor M33 and a first pole of the sixth pull-down control transistor M34 are all connected with the fourth voltage terminal VDDB, and a second pole of the fifth pull-down control transistor M33 and a control pole of the sixth pull-down control transistor M34 are both connected with a first pole of the seventh pull-down control transistor M35. A control pole of the seventh pull-down control transistor M35 and a control pole of the eighth pull-down control transistor M36 are both connected with the second pull-up node Q<N+1>, a second pole of the seventh pull-down control transistor M35 and a second pole of the eighth pull-down control transistor M36 are both connected with the first voltage terminal VGL1, and a first pole of the eighth pull-down control transistor M36 and a second pole of the sixth pull-down control transistor M34 are both connected with the second pull-down node S<N>. The second pull-down circuit may include a sixth pull-down transistor M37, a seventh pull-down transistor M38, an eighth pull-down transistor M39, an ninth pull-down transistor M40 and a tenth pull-down transistor M41. Control poles of the sixth pull-down transistor M37, the seventh pull-down transistor M38, the eighth pull-down transistor M39, the ninth pull-down transistor M40 and the tenth pull-down transistor M41 are all connected with the second pull-down node S<N>. A first pole of the sixth pull-down transistor M37 is connected with the second pull-up node Q<N+1>, and a second pole of the sixth pull-down transistor M37 is connected with the above voltage control node E<N>. A second pole of the seventh pull-down transistor M38 is connected with the first voltage terminal VGL1, and a first pole of the seventh pull-down transistor M38 is connected with the above second cascading signal output terminal CR2<N+1>. A first pole of the eighth pull-down transistor M39 is connected with the above second pixel scanning signal output terminal OUT2<N+1>, and a second pole of the eighth pull-down transistor M39 is connected with the third voltage terminal VGL2. A first pole of the ninth pull-down transistor M40 is connected with the first pull-up node Q<N>, a second pole of the ninth pull-down transistor M40 and a first pole of the tenth pull-down transistor M41 are both connected with the voltage control node E<N>, and a second pole of the tenth pull-down transistor M41 is connected with the first voltage terminal VGL1.

As shown in FIG. 5, the shift register unit of the present disclosure may further include an auxiliary input circuit. The auxiliary input circuit is connected with the first voltage terminal VGL1, the first pull-down node W<N>, the second pull-down node S<N>, the display control signal terminal CR<N−4>, the compensation node K<N>, the black insertion node H<N> and the clock signal terminal. The auxiliary input circuit is configured to, under the control of the display control signal terminal CR<N−4>, control the first voltage terminal VGL1 to communicate with the first pull-down node W<N> and the second pull-down node S<N>; the auxiliary input circuit is configured to, under the control of the clock signal terminal and the potential of the black insertion node H<N>, control the first voltage terminal VGL1 to communicate with the first pull-down node W<N> and the second pull-down node S<N>; and the auxiliary input circuit is configured to, under the control of the clock signal terminal and the potential of the compensation node K<N>, control the first voltage terminal VGL1 to communicate with the first pull-down node W<N> and the second pull-down node S<N>. For example, the auxiliary input circuit may include a first auxiliary transistor M42, a second auxiliary transistor M43, a third auxiliary transistor M44, a fourth auxiliary transistor M45, a fifth auxiliary transistor M46, a sixth auxiliary transistor M47, a seventh auxiliary transistor M48, an eighth auxiliary transistor M49, a ninth auxiliary transistor M50, and a tenth auxiliary transistor M51. A control pole of the first auxiliary transistor M42 is connected with the display control signal terminal CR<N−4>, a first pole of the first auxiliary transistor M42, a first pole of the second auxiliary transistor M43 and a first pole of the fourth auxiliary transistor M45 are all connected with the first pull-down node W<N>. A second pole of the first auxiliary transistor M42, a second pole of the third auxiliary transistor M44 and a second pole of the fifth auxiliary transistor M46 are all connected with the first voltage terminal VGL1. A control pole of the second auxiliary transistor M43 is connected with the compensation node K<N>, a control pole of the third auxiliary transistor M44 is connected with the clock signal terminal, a control pole of the fourth auxiliary transistor M45 is connected with the black insertion node H<N>, and a control pole of the fifth auxiliary transistor M46 is connected with the clock signal terminal. A control pole of the sixth auxiliary transistor M47 is connected with the display control signal terminal CR<N−4>, a first pole of the sixth auxiliary transistor M47, a first pole of the seventh auxiliary transistor M48 and a first pole of the ninth auxiliary transistor M50 are all connected with the second pull-down node S<N>, and a second pole of the sixth auxiliary transistor M47, a second pole of the eighth auxiliary transistor M49 and a second pole of the tenth auxiliary transistor M51 are all connected with the first voltage terminal VGL1. A control pole of the seventh auxiliary transistor M48 is connected with the compensation node K<N>, a control pole of the eighth auxiliary transistor M49 is connected with the clock signal terminal, a control pole of the ninth auxiliary transistor M50 is connected with the black insertion node H<N>, and a control pole of the tenth auxiliary transistor M51 is connected with the clock signal terminal.

Figure 9:
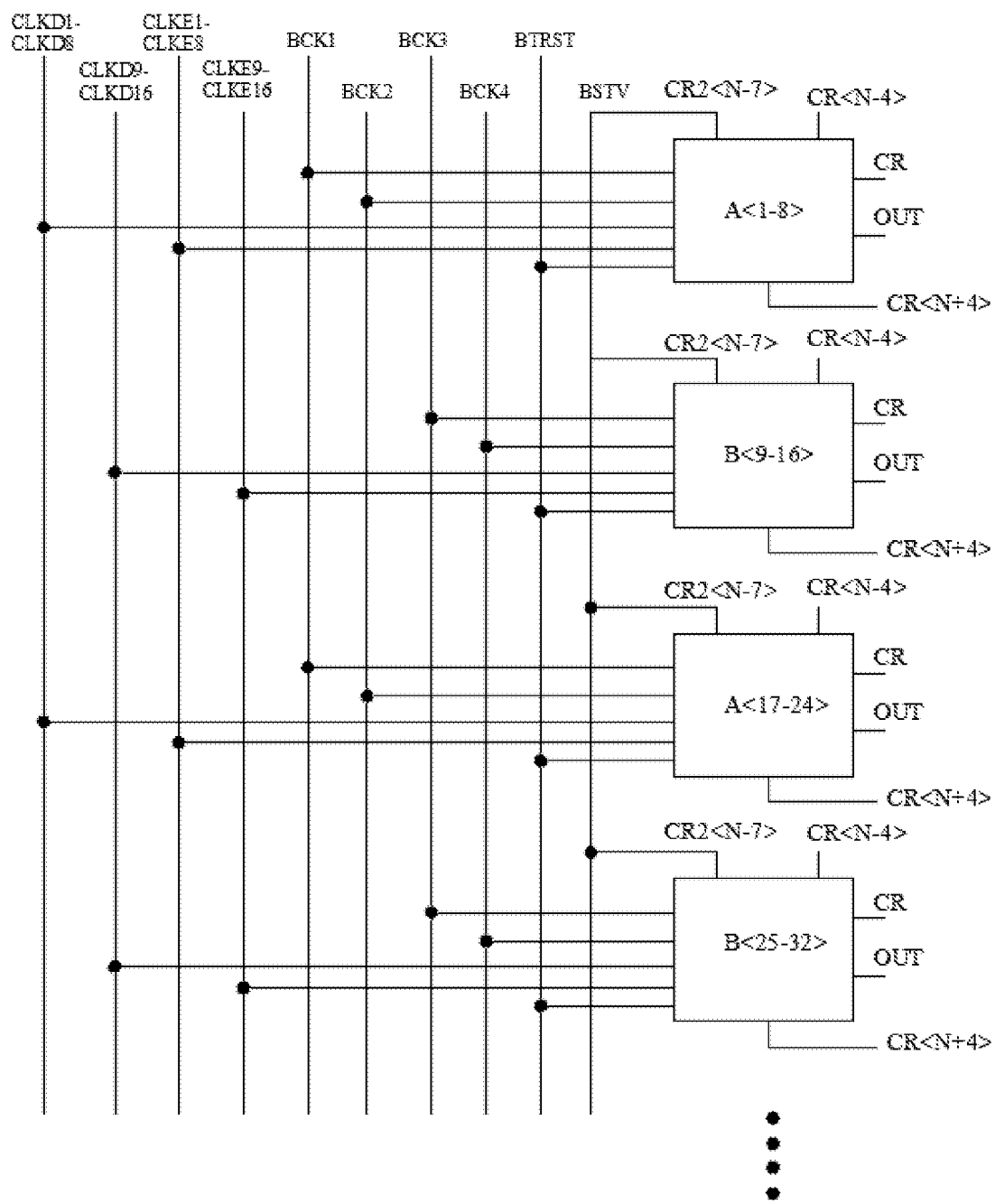
FIG. 9 is a schematic diagram illustrating a gate drive circuit according to an embodiment of the present disclosure.
Figure 10:
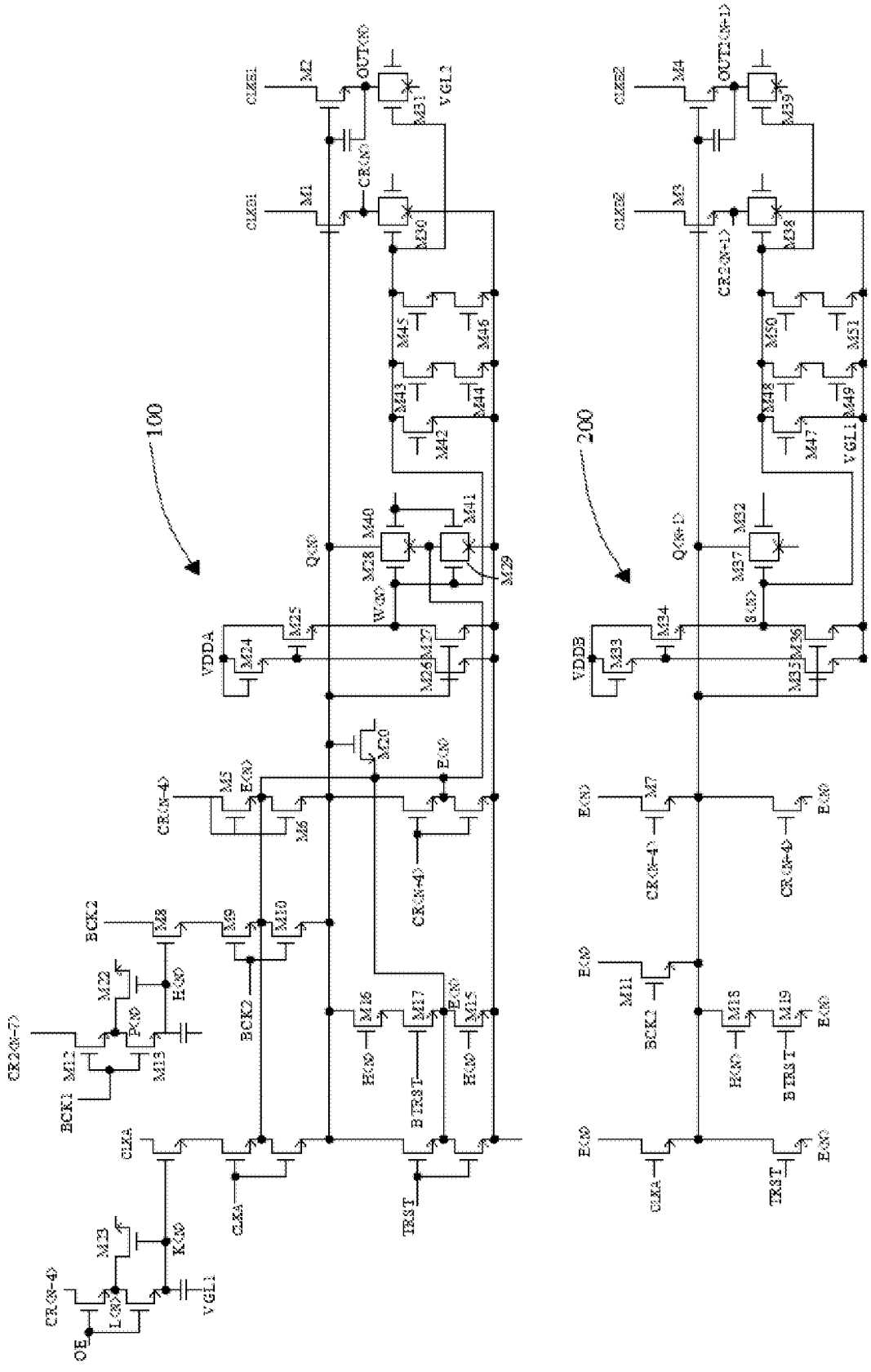
FIG. 10 is a schematic diagram illustrating A<1-8> in the gate drive circuit shown in FIG. 9.
Figure 11:
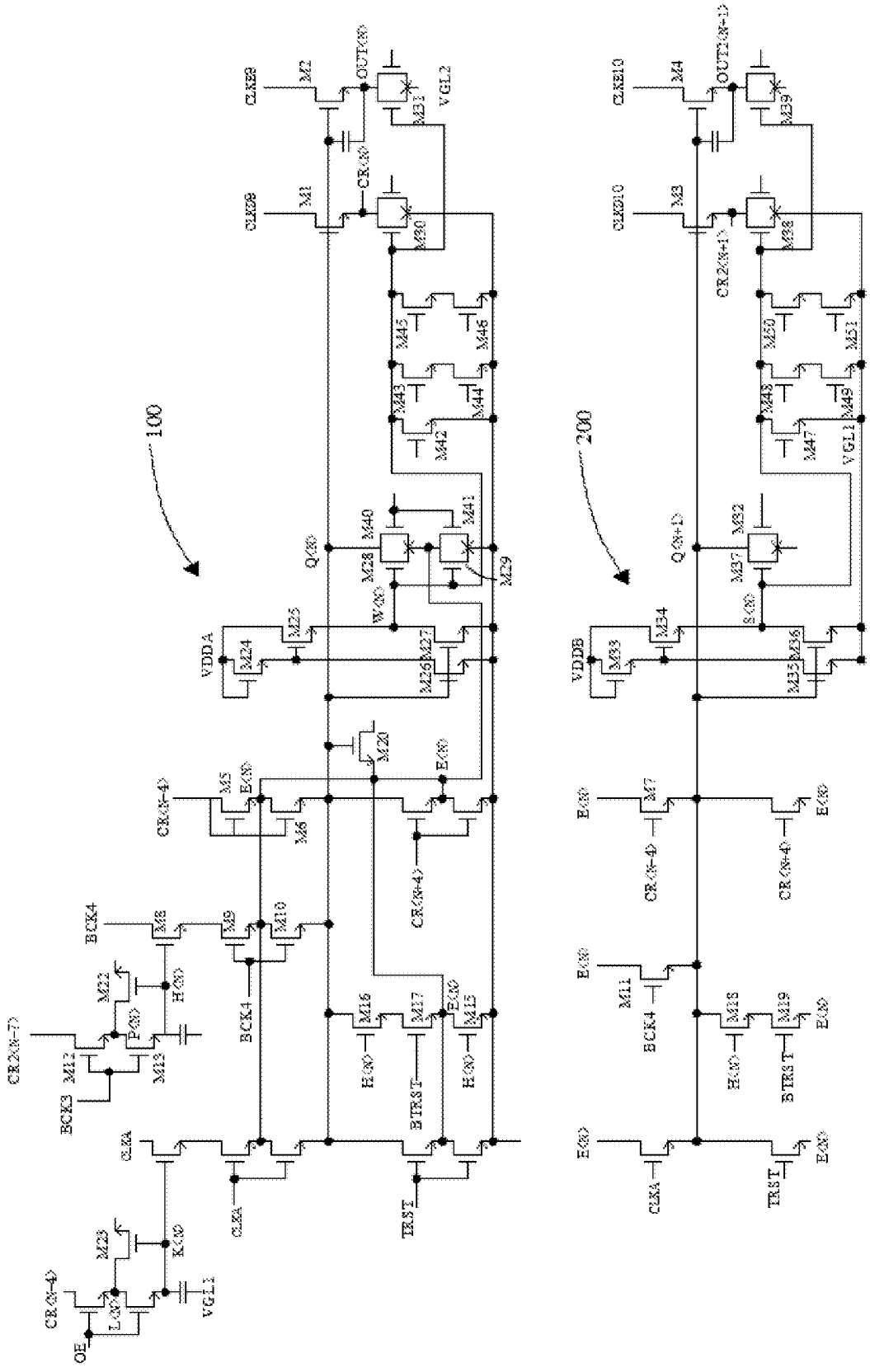
FIG. 11 is a schematic diagram illustrating B<9-16> in the gate drive circuit shown in FIG. 9.

One or more embodiments of the present disclosure further provide a gate drive circuit. As shown in FIG. 9, the gate drive circuit may include a plurality of cascaded shift register units as described above. In FIG. 9, A<1-8> includes four shift register units, the structure of which is as shown in FIG. 10. Each shift register unit in FIG. 10 includes a first shift register component 100 and a second shift register component 200, namely, A<1-8> in FIG. 9 includes a total of eight shift register components, i.e. eight rows of shift register components. The first shift register component 100 and the second shift register component 200 are connected with different pixel rows respectively. In FIG. 9, B<9-16> includes four shift register units, the structure of which is as shown in FIG. 11. Each shift register unit in FIG. 11 includes a first shift register component 100 and a second shift register component 200, and the first shift register component 100 and the second shift register component 200 are connected with different pixel rows respectively. In FIG. 9, A<17-24> has the same structure as A<1-8> and B<9-16> has the same structure as B<25-32>. Further, the gate drive circuit further includes two virtual shift register units, namely, four rows of virtual shift register components. The four rows of virtual shift register components only output cascading signals for cascading rather than output black insertion signals and the like. Further, the four rows of virtual shift register components have no black insertion node controlling module, black insertion input circuit and compensating module as described above.

As shown in FIGS. 9-11, the gate drive circuit is connected with a clock signal terminal BCK1, a clock signal terminal BCK2, a clock signal terminal BCK3, a clock signal terminal BCK4, a clock signal terminal CLKD, a clock signal terminal CLKE and a black insertion start signal terminal BSTV, the rows 5-12 are connected with the clock signal terminals BCK1 and BCK2, and the rows 13-20 are connected with the clock signal terminals BCK3 and BCK4.

Figure 12:
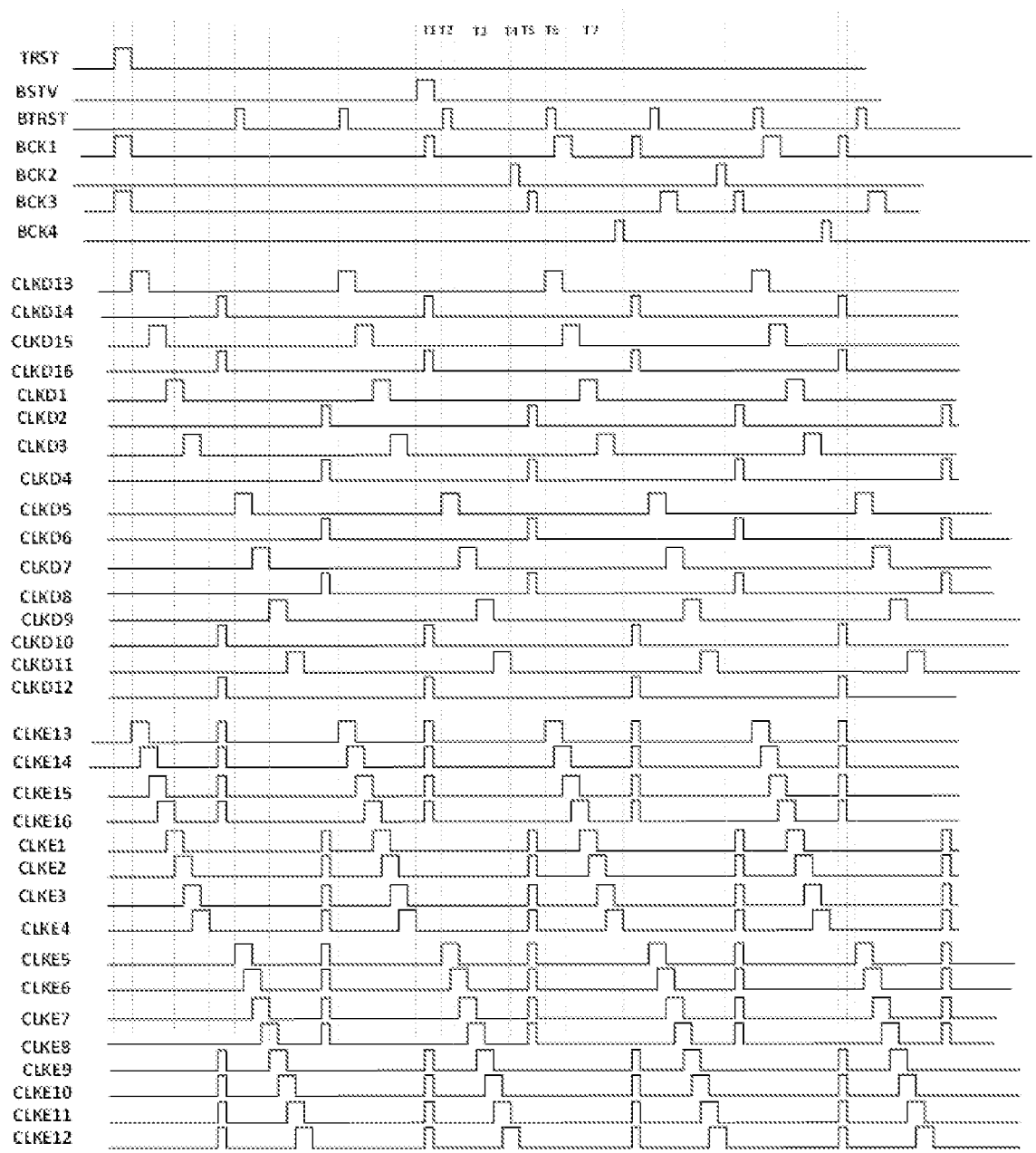
FIG. 12 is a time sequence diagram of a gate drive circuit according to an embodiment of the present disclosure.

For example, all transistors are N-type transistors. In combination with FIG. 1 and FIGS. 9-12, the working principle of the gate drive circuit is described. The signals of the clock signal terminals CLKE13-16 in FIG. 12 are output to the above four rows of virtual shift register components. The working process of the gate drive circuit includes T1-T7 stages.

In the T1 stage, the black insertion start signal terminal BSTV and the clock signal terminal BCK1 output a high potential at the same time, and M12 and M13 of the shift register components of rows 5-12 are turned on, such that the high potential is written into the black insertion nodes H<5/7/9/11>, where the shift register components of rows 5-12 correspond to CLKD1-8 and CLKE1-8.

In the stages T2, T3 and T4, the reset signal terminal BTRST outputs a high potential to perform resetting for the pull-up node Q of the row in which the black insertion node is at the high potential (performing resetting only for the pull-up nodes of rows 5-12 at present). At the same time, the gate electrodes of the data write transistors U1 of the pixel circuits corresponding to the pixel rows of rows 25-32 are turned on sequentially to allow writing of display data. When the data is written for row 32, the clock signal terminal BCK2 outputs a high potential, and M8, M9, M10 and M11 are turned on to write the high potential output by the clock signal terminal BCK2 into the pull-up nodes Q<5-12>. Furthermore, in the T2 stage, since the black insertion node H<29> is of low potential, M15 is in an off state to prevent electric leakage of the pull-up node Q.

In the T5 stage, the clock signal terminals CLKE1-8 output a high potential and OUT of rows 5-12 output a high potential. In this case, the data signal Data of the pixel circuit is also set to be of low potential. Therefore, the node A of the pixel circuit is set to be of low potential, and black insertion is performed for rows 5-12 to display a black picture. Furthermore, the clock signal terminals CLKD2/4/6/8 and the clock signal terminal BCK3 output a high potential such that the second cascading signal output terminals CR2<6/8/10/12> output a high potential to the black insertion nodes H<13/15/17/19> and maintain it until the next black insertion stage. In this circuit, the clock signal terminals CLKD2/4/6/8 may also be replaced with one clock signal terminal CLKD8, which can be implemented in a manner that the second cascading signal output terminal CR2<12> is connected to one end of M12 of rows 13/15/17/19 to form a one-to-many input mode.

In the stages T6 and T7, the reset signal terminal BTRST outputs a high potential and the black insertion nodes H of rows 5-12 are also of high potential. Therefore, M15, M16, M17, M18 and M19 are all turned on to perform resetting for the pull-up nodes Q of rows 5-12 through the first voltage terminal VGL1. Next, the clock signal terminal BCK1 outputs a high potential to turn on M12 and M13 such that the black insertion nodes H<5/7/9/11> are reset to be of low potential. In this stage, the gate electrode of the data write transistor U1 of the pixel circuit of row 33 of pixels is turned on to allow writing of display data. As mentioned above, combination of display and black insertion can be achieved by continuous cycling.

One or more embodiments of the present disclosure further provide a display apparatus including the above gate drive circuit.

One or more embodiments of the present disclosure further provide a driving method of a shift register unit. The driving method is applicable to the above shift register unit.

The driving method includes: causing/enabling the outputting module to output a composite output signal under the control of the potential of the pull-up node; causing/enabling the pull-up module to charge the pull-up node under the control of the display control signal terminal and charge the pull-up node under the control of the potential of the black insertion node; causing/enabling the first reset circuit to, under the control of the reset signal terminal and the potential of the black insertion node, control the voltage control node to communicate with the pull-up node; causing/enabling the charging module to charge the voltage control node under the control of the potential of the pull-up node.

The display apparatuses, the gate drive circuits, the shift register units and the driving methods thereof according to the embodiments of the present disclosure belong to a same inventive thought, and reference may be made to each other for relevant details and beneficial effects and therefore no redundant descriptions will be made herein.

The above descriptions are merely made to preferred embodiments of the present disclosure rather than intended to limit the present disclosure in any manner. Although the present disclosure is made with preferred embodiments as above, these preferred embodiments are not used to limit the present disclosure. Those skilled in the art may make some changes or modifications to the technical contents of the present disclosure as equivalents without departing from the scope of the technical solution of the present disclosure. Any simple changes, equivalent changes or modifications made to the above embodiments based on the technical essence of the present disclosure without departing from the contents of the technical solution of the present disclosure shall all fall within the scope of protection of the present disclosure.

What is claimed is:

1. A shift register unit, comprising:
   an outputting module, connected with a pull-up node and configured to output a composite output signal under a control of a potential of the pull-up node;
   a pull-up module, connected with a display control signal terminal, a black insertion node and the pull-up node, and configured to charge the pull-up node under a control of the display control signal terminal and charge the pull-up node under a control of a potential of the black insertion node;
   a reset and leakage prevention composite module, comprising a first reset circuit and a current-limiting circuit, wherein the first reset circuit is connected with a reset signal terminal, a voltage control node, the black insertion node and the pull-up node and is configured to, under a control of the reset signal terminal and the potential of the black insertion node, control the voltage control node to communicate with the pull-up node; the current-limiting circuit is connected between the voltage control node and a first voltage terminal; and
   a charging module, connected with the voltage control node and the pull-up node and configured to charge the voltage control node under the control of the potential of the pull-up node.

2. The shift register unit of claim 1, wherein the current-limiting circuit is connected with the black insertion node, and is configured to control the first voltage terminal to communicate with the voltage control node under the control of the potential of the black insertion node.

3. The shift register unit of claim 2, wherein the current-limiting circuit comprises:
   a leakage prevention transistor, wherein a control pole of the leakage prevention transistor is connected with the black insertion node, a first pole of the leakage prevention transistor is connected with the voltage control node, and a second pole of the leakage prevention transistor is connected with the first voltage terminal.

4. The shift register unit of claim 2, wherein the current-limiting circuit comprises:
   an auxiliary reset transistor, wherein a control pole of the auxiliary reset transistor is connected with the reset signal terminal, and a first pole of the auxiliary reset transistor is connected with the voltage control node; and
   a leakage prevention transistor, wherein a control pole of the leakage prevention transistor is connected with the black insertion node, a first pole of the leakage prevention transistor is connected with a second pole of the auxiliary reset transistor, and a second pole of the leakage prevention transistor is connected with the first voltage terminal.

5. The shift register unit of claim 1, wherein the current-limiting circuit comprises:
   a current-limiting transistor, wherein a control pole and a first pole of the current-limiting transistor are both connected with the voltage control node, a second pole of the current-limiting transistor is connected with the first voltage terminal, and the current-limiting transistor is configured to turn on when a potential of the first pole of the current-limiting transistor is greater than a potential of the second pole of the current-limiting transistor.

6. The shift register unit of claim 1, further comprising:
   a black insertion node controlling module, connected with the black insertion node, a first charge node and a clock signal terminal, and configured to charge the first charge node under a control of the clock signal terminal and control the first charge node to communicate with the black insertion node under the control of the clock signal terminal; and
   the charging module is further connected with the first charge node and the black insertion node and is configured to, under a control of the potentials of the black insertion node and the pull-up node, control the first charge node to communicate with the voltage control node.

7. The shift register unit of claim 1, further comprising:
   a compensating module, comprising a compensation control circuit and a compensation output circuit,
   wherein the compensation control circuit is connected with the display control signal terminal, a compensation control signal terminal, a second charge node and a compensation node and is configured to, under a control of the compensation control signal terminal, control the display control signal terminal to communicate with the second charge node, and under the control of the compensation control signal terminal, control the compensation node to communicate with the second charge node; and
   the compensation output circuit is connected with the compensation node, a clock signal terminal and the pull-up node, and is configured to charge the pull-up node under a control of the compensation node and the clock signal terminal.

8. The shift register unit of claim 7, wherein the charging module is further connected with the second charge node and the compensation node and is configured to, under a control of the compensation node and the potential of the pull-up node, control the second charge node to communicate with the voltage control node.

9. The shift register unit of claim 1, wherein the pull-up module comprises:
a display input circuit, connected with the display control signal terminal, the pull-up node and the voltage control node and configured to, under the control of the display control signal terminal, charge the voltage control node, and under the control of the display control signal terminal, control the voltage control node to communicate with the pull-up node.

10. A gate drive circuit, comprising a plurality of cascaded shift register units, wherein each of the shift register units comprises:
an outputting module, connected with a pull-up node and configured to output a composite output signal under a control of a potential of the pull-up node;
a pull-up module, connected with a display control signal terminal, a black insertion node and the pull-up node, and configured to charge the pull-up node under a control of the display control signal terminal and charge the pull-up node under a control of a potential of the black insertion node;
a reset and leakage prevention composite module, comprising a first reset circuit and a current-limiting circuit, wherein the first reset circuit is connected with a reset signal terminal, a voltage control node, the black insertion node and the pull-up node and is configured to, under a control of the reset signal terminal and the potential of the black insertion node, control the voltage control node to communicate with the pull-up node; the current-limiting circuit is connected between the voltage control node and a first voltage terminal; and
a charging module, connected with the voltage control node and the pull-up node and configured to charge the voltage control node under the control of the potential of the pull-up node.

11. The gate drive circuit of claim 10, wherein the current-limiting circuit is connected with the black insertion node, and is configured to control the first voltage terminal to communicate with the voltage control node under the control of the potential of the black insertion node.

12. The gate drive circuit of claim 11, wherein the current-limiting circuit comprises:
a leakage prevention transistor, wherein a control pole of the leakage prevention transistor is connected with the black insertion node, a first pole of the leakage prevention transistor is connected with the voltage control node, and a second pole of the leakage prevention transistor is connected with the first voltage terminal.

13. The gate drive circuit of claim 11, wherein the current-limiting circuit comprises:
an auxiliary reset transistor, wherein a control pole of the auxiliary reset transistor is connected with the reset signal terminal, and a first pole of the auxiliary reset transistor is connected with the voltage control node; and
a leakage prevention transistor, wherein a control pole of the leakage prevention transistor is connected with the black insertion node, a first pole of the leakage prevention transistor is connected with a second pole of the auxiliary reset transistor, and a second pole of the leakage prevention transistor is connected with the first voltage terminal.

14. The gate drive circuit of claim 10, wherein the current-limiting circuit comprises:
a current-limiting transistor, wherein a control pole and a first pole of the current-limiting transistor are both connected with the voltage control node, a second pole of the current-limiting transistor is connected with the first voltage terminal, and the current-limiting transistor is configured to turn on when a potential of the first pole of the current-limiting transistor is greater than a potential of the second pole of the current-limiting transistor.

15. The gate drive circuit of claim 10, wherein the shift register unit further comprises:
a black insertion node controlling module, connected with the black insertion node, a first charge node and a clock signal terminal, and configured to charge the first charge node under a control of the clock signal terminal and control the first charge node to communicate with the black insertion node under the control of the clock signal terminal; and
the charging module is further connected with the first charge node and the black insertion node and is configured to, under a control of the potentials of the black insertion node and the pull-up node, control the first charge node to communicate with the voltage control node.

16. The gate drive circuit of claim 10, wherein the shift register unit further comprises:
a compensating module, comprising a compensation control circuit and a compensation output circuit,
wherein the compensation control circuit is connected with the display control signal terminal, a compensation control signal terminal, a second charge node and a compensation node and is configured to, under a control of the compensation control signal terminal, control the display control signal terminal to communicate with the second charge node, and under the control of the compensation control signal terminal, control the compensation node to communicate with the second charge node; and
the compensation output circuit is connected with the compensation node, a clock signal terminal and the pull-up node, and is configured to charge the pull-up node under a control of the compensation node and the clock signal terminal.

17. The gate drive circuit of claim 16, wherein the charging module is further connected with the second charge node and the compensation node and is configured to, under a control of the compensation node and the potential of the pull-up node, control the second charge node to communicate with the voltage control node.

18. The gate drive circuit of claim 10, wherein the pull-up module comprises:
a display input circuit, connected with the display control signal terminal, the pull-up node and the voltage control node and configured to, under the control of the display control signal terminal, charge the voltage control node, and under the control of the display control signal terminal, control the voltage control node to communicate with the pull-up node.

19. A display apparatus, comprising a gate drive circuit comprising a plurality of cascaded shift register units, wherein each of the shift register units comprises:
an outputting module, connected with a pull-up node and configured to output a composite output signal under a control of a potential of the pull-up node;
a pull-up module, connected with a display control signal terminal, a black insertion node and the pull-up node and configured to, under a control of the display control signal terminal, charge the pull-up node, and under a control of a potential of the black insertion node, charge the pull-up node;

a reset and leakage prevention composite module, comprising a first reset circuit and a current-limiting circuit, wherein the first reset circuit is connected with a reset signal terminal, a voltage control node, the black insertion node and the pull-up node and is configured to, under a control of the reset signal terminal and the potential of the black insertion node, control the voltage control node to communicate with the pull-up node; the current-limiting circuit is connected between the voltage control node and a first voltage terminal; and a charging module, connected with the voltage control node and the pull-up node and configured to charge the voltage control node under the control of the potential of the pull-up node.

20. A driving method of a shift register unit, applicable to the shift register unit of claim 1 and the driving method comprising:

enabling the outputting module to output a composite output signal under the control of the potential of the pull-up node;

enabling the pull-up module to charge the pull-up node under the control of the display control signal terminal and charge the pull-up node under the control of the potential of the black insertion node;

enabling the first reset circuit to, under the control of the reset signal terminal and the potential of the black insertion node, control the voltage control node to communicate with the pull-up node; and enabling the charging module to, under the control of the potential of the pull-up node, charge the voltage control node.

* * * * *